Figure 1:
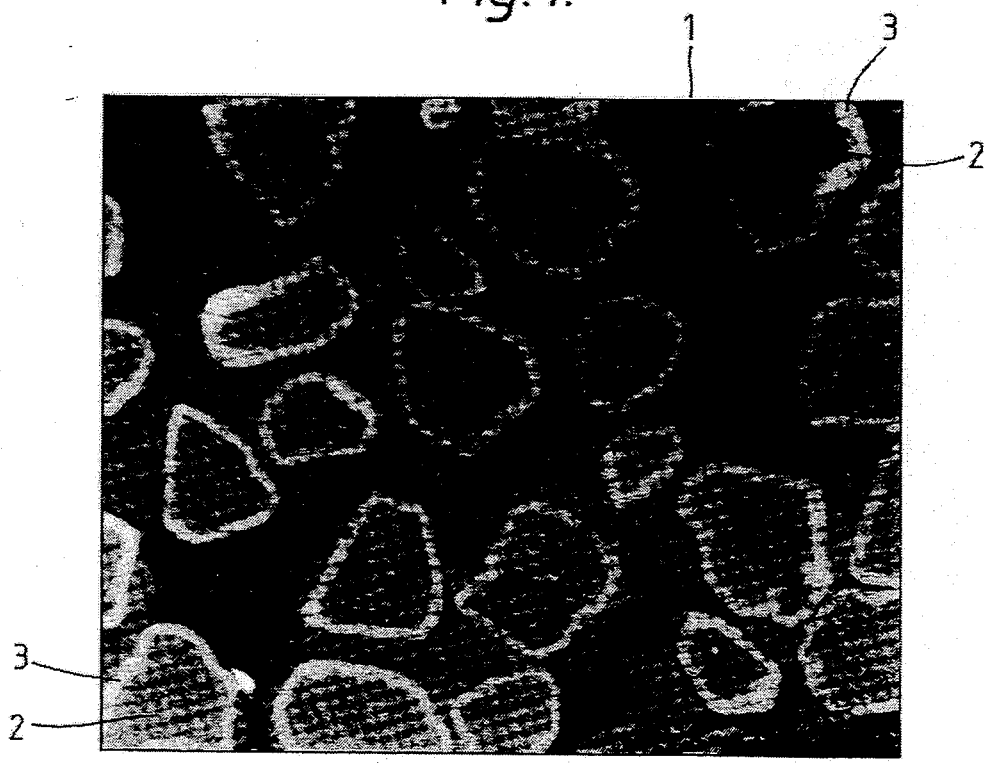

United States Patent [19]

Wiltshire et al.

[11] Patent Number: 5,355,637

[45] Date of Patent: Oct. 18, 1994

[54] ABRASIVE MEDIUM

[75] Inventors: Alan D. Wiltshire, Bristol; Terry E. Rowen, Derby, both of Great Britain

[73] Assignee: Rolls-Royce plc, London, United Kingdom

[21] Appl. No.: 120,238

[22] Filed: Sep. 14, 1993

Related U.S. Application Data

[63] Continuation of Ser. No. 889,798, May 29, 1992, abandoned.

[30] Foreign Application Priority Data

Jun. 4, 1991 [GB] United Kingdom ............... 9111999

[51] Int. Cl.$^5$ ............................................. B24D 11/00
[52] U.S. Cl. ........................................ 51/295; 51/293;
51/309; 415/174.2; 416/229 R; 416/241 B
[58] Field of Search ................. 51/293, 295, 309;
415/174.2; 416/229 R, 241 R, 241 B

[56] References Cited

U.S. PATENT DOCUMENTS

| | | |
|---|---|---|
| Re. 31,883 | 5/1985 | Bovenkerk et al. ................ 51/295 |
| 3,199,836 | 8/1965 | Moyer ................................. 415/220 |
| 3,645,706 | 2/1972 | Bovenkerk et al. ................ 51/295 |
| 3,899,267 | 8/1975 | Dennis et al. ...................... 416/228 |
| 4,232,995 | 11/1980 | Stalker et al. ..................... 416/228 |
| 5,094,671 | 3/1992 | Hall et al. ............................ 51/293 |

FOREIGN PATENT DOCUMENTS

| | | |
|---|---|---|
| 181258 | 5/1986 | European Pat. Off. . |
| 60-165340 | 8/1985 | Japan . |
| 56145199 | 11/1987 | Japan . |
| 1133982 | 5/1989 | Japan . |
| 742324 | 5/1953 | United Kingdom . |
| 1513990 | 6/1978 | United Kingdom . |
| 2048927 | 12/1980 | United Kingdom . |

*Primary Examiner*—Mark L. Bell
*Assistant Examiner*—Willie J. Thompson
*Attorney, Agent, or Firm*—Oliff & Berridge

[57] ABSTRACT

An abrasive medium suitable for the cutting tip of a turbine blade of a gas turbine engine comprises cubic boron nitride grit coated with a layer of aluminum nitride. Coating of the grit particles is carried out by vapour deposition in a fluidised bed reaction.

22 Claims, 1 Drawing Sheet

AlN COATED CUBIC BORON NITRIDE. ×100

AlN COATED CUBIC BORON NITRIDE. ×100

ABRASIVE MEDIUM

This is a continuation of application Ser. No. 07/889,798, filed May 29, 1992, now abandoned.

The invention relates to a turbine blade for an aeroengine. In particular, the invention concerns a turbine blade having an abrasive tip.

It is well known in the technical field for aeroengines to be designed with shroudless turbine stages. Turbine efficiency is reduced by gas path leakage over the tips of the turbine blades, since gas lost in this way does no useful work. In more traditional turbine designs the radially outer ends of the turbine blades are provided with shrouds to reduce leakage. The shrouds of adjacent blades abut one another and effectively form an annular shroud ring. The upstream and downstream sides of this ring are sealed relative to the static engine casing.

However, the weight of the shroud ring generates high centrifugal loads. Blade creep, that is elongation due to the high loads, limits rotor speed and life. The power which can be extracted from the turbine is determined, amongst other things, by its speed, and that is limited by the disadvantages of the blade tip shrouds. Shroudless blades offer the advantage of higher rotor speed and greater power output provided the gas path leakage problem is solved.

A solution adopted in some modern gas turbine engines involves shroudless turbine blades with abrasive tips adapted to co-operate with an abradable liner. In theory, clearances over the turbine blade tips can be reduced significantly, for normal running conditions. Should a tip-rub occur as a result of engine casing distortion, for example, the abrasive tips will cut a track in the abradable liners. The incursion is only as deep as it needs to be and any increase in over-top leakage is minimised.

A typical abradable liner, abrasive tip system consists of a layer of porous ceramic material deposited on nickel alloy liners and hard cutting grits embedded in a nickel alloy matrix on blade tips. A suitable cutting material often used is boron nitride in cubic crystal form. This material is second only to diamond in hardness. However, boron nitride suffers from an inherent disadvantage in that is has only a relatively short lifetime at turbine exhaust temperatures before being completely oxidised.

The present invention is intended to overcome this drawback by coating the abrasive grits with a protective layer.

Accordingly, the invention in its broadest form provides abrasive grits of cubic boron nitride coated with material that resists oxidation of the cubic boron nitride.

According to one aspect of the invention an abrasive medium comprises a dispersion of coated cubic boron nitride grits in oxidation resistant material that resists oxidation of the cubic boron nitride.

Preferably the material that resists oxidation of the cubic boron nitride has a hardness greater than 1250 Vickers and may comprise aluminum nitride.

Figure 2:
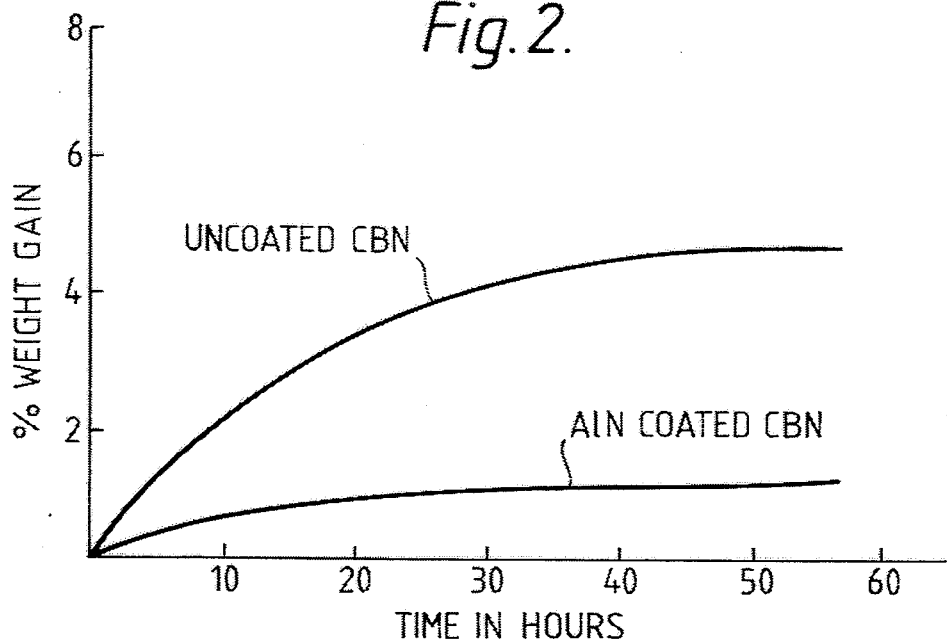

The invention and how it may be carried into practice will now be described, by way of example only, with reference to a preferred embodiment illustrated in the accompanying figures, in which:

FIG. 1 shows a section through a laboratory sample of aluminum nitride coated cubic boron nitride grits in a supporting medium, and FIG. 2 shows a graph of weight gain against time of coated and uncoated cubic boron nitride grits in an oxidation test.

Cubic boron nitride is an extremely hard material almost equal to the hardness of diamond. Its use in the cutting tips of aerofoil blades in a gas turbine engine is documented. In order to maximise the efficiency of a rotor stage tip clearances are made small to minimise gas leakage over the blade tips. An abradable liner is installed on the inside of the gas duct encircling the blades which are provided with cutting tips. Because of its extreme hardness cubic boron nitride improves the efficiency of the blades in cutting a path into the abradable liner. Unfortunately, boron nitride is not temperature tolerant for long periods and it is found in practice that CBN grits in the cutting tips of turbine blades disappear after very few hours. The material simply oxidises progressively until eventually only empty holes are left in the supporting nickel alloy matrix.

The invention provides that the cubic boron nitride grits are encased in a hard metal alloy coating that resists oxidation of the cubic boron nitride to preserve their cutting ability. Thus, although grits which are partly worn by a tip rub oxidise away over a period of time, other grit particles on which the protective coating remains intact survive to preserve tip cutting ability. FIG. 1 shows a typical section through a coated grits sample. The supporting medium is indicated at 1, a cubic boron nitride grit particle is indicated at 2, and its protective layer of aluminum nitride at 3.

The aluminum nitride coatings were deposited by a vapour deposition process. Cubic boron nitride grit of approximately 200$\mu$m size was placed in a vessel the base of which was formed by a sintered quartz disc through which fluidising gas could be passed. The coating was then deposited by reacting aluminum chloride with ammonia at 900° C. and, at a reduced pressure of about 20 mb, forcing the reagent gases through the sintered disc to fluidise the grits. The process was continued to deposit an even coating of aluminum nitride to an even depth of 15–20$\mu$m. The equation of the reaction is:

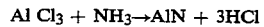

$$Al\ Cl_3 + NH_3 \rightarrow AlN + 3HCl$$

The stability of the coated grit particles was tested by exposing test samples of coated and uncoated grit at high temperature in an oxidising atmosphere for extended periods. The results for each sample are shown superimposed in the graph of FIG. 2. In this figure percentage weight gain of a test sample is plotted in the ordinate direction against elapsed time as abscissa. Relative to the uncoated grit, the coated grit particles gained about four times less weight.

Any one of a range of coating processes may be employed to deposit aluminum nitride on the surfaces of the grit particles; physical vapour deposition, physical vapour chemical deposition and sputter ion plating to mention just three.

Some weight gain is inevitable due to oxidation of aluminum nitride at least. The reaction:

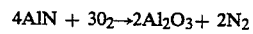

$$4AlN + 3O_2 \rightarrow 2Al_2O_3 + 2N_2$$

represents about 25% increase in coating weight as aluminum nitride is converted to alumina. On the other hand the conversion of boron nitride to boric oxide represented by the reaction:

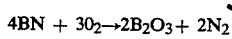

results in approximately 40% weight increase.

We claim:

1. An abrasive medium comprising a dispersion of a plurality of discrete cubic boron nitride particles, and a continuous coating of a material that resists oxidation of the cubic boron nitride surrounding said plurality of particles of said dispersion.

2. An abrasive medium as in claim 1, wherein the material has ia hardness greater than 1250 Vickers.

3. An abrasive medium as in claim 2, wherein the material comprises aluminum nitride.

4. An abrasive medium as in claim 3, wherein the depth of the aluminum nitride coating on the particles is about 15-20.

5. An abrasive medium as claim 1, wherein the cubic boron nitride particles are dispersed in a metallic matrix.

6. An abrasive medium as in claim 5, wherein the metallic matrix comprises a nickel based alloy.

7. A process for producing an abrasive medium comprising the steps of:
   fluidising a bed of cubic boron nitride particles; and
   depositing a material that resists oxidation of the cubic boron nitride on the boron nitride particles during the fluidising step.

8. A process as in claim 7, wherein the depositing step comprises vapor deposition.

9. A process as in claim 7, wherein the material is aluminum nitride.

10. A process as in claim 9, wherein the aluminum deposited in the aluminum nitride deposited in the depositing step is produced by the reaction:

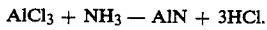

11. A process as in claim 10, wherein the reaction is carried out at a temperature of about 900° C. and at a pressure of approximately 10 mb.

12. A process as in claim 7, wherein during the depositing step, a continuous coating of the material that resists oxidation of the cubic boron nitride is formed on the cubic boron nitride particles.

13. An abrasive member comprising:
    a supporting body; and
    an abrasive portion formed on said supporting body, said abrasive portion comprising a dispersion of discrete cubic boron nitride particles on a portion of the body, said cubic boron nitride particles being completely coated with a material that resists oxidation of the cubic boron nitride.

14. An abrasive body as in claim 13, further comprising a metallic matrix material for bonding the coated particles on the body.

15. An abrasive body as in claim 14, wherein the metallic matrix material comprises a nickel-based alloy.

16. An abrasive body as in claim 15 wherein the support body comprises a gas turbine engine blade.

17. A gas turbine engine blade comprising:
    a blade body having a tip portion; and
    an abrasive portion formed on said tip portion, said abrasive portion comprising a dispersion of discrete particles of cubic boron nitride disposed on the tip portion, the particles being completely coated with a material that resists oxidation of the cubic boron nitride.

18. The turbine engine blade as in claim 17, wherein the coating material that resists oxidation of the cubic boron nitride has a hardness greater than 120 Vickers.

19. The turbine engine blade as in claim 18, wherein the coating material that resists oxidation of the cubic boron nitride comprises aluminum nitride.

20. The turbine engine blade as in claim 19, wherein the depth of the aluminum nitride coating on the particles is about 15-20 $\mu$m.

21. The turbine engine blade as in claim 17, wherein the cubic boron nitride particles are disposed in a metallic matrix.

22. The turbine engine blade as in claim 21, wherein the metallic matrix comprises a nickel based alloy.

* * * * *